(12) United States Patent
Lo

(10) Patent No.: US 6,360,812 B1
(45) Date of Patent: Mar. 26, 2002

(54) HEAT DISSIPATING ASSEMBLY

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/660,215

(22) Filed: Sep. 12, 2000

(30) Foreign Application Priority Data

Jul. 12, 2000 (TW) .......................................... 089212003

(51) Int. Cl.⁷ ................................................. H05K 7/20
(52) U.S. Cl. ........................ 165/80.3; 257/719; 361/704
(58) Field of Search ............................... 165/80.3, 185; 361/704; 257/718, 719, 722; 174/16.3

(56) References Cited

U.S. PATENT DOCUMENTS

| | | | | |
|---|---|---|---|---|
| 6,037,660 A | * | 3/2000 | Liu | 257/722 |
| 6,105,215 A | * | 8/2000 | Lee | 24/458 |
| 6,115,253 A | * | 9/2000 | Clemens et al. | 361/704 |
| 6,205,026 B1 | * | 3/2001 | Wong et al. | 361/704 |
| 6,246,584 B1 | * | 6/2001 | Lee et al. | 361/704 |

* cited by examiner

*Primary Examiner*—Allen Flanigan
(74) *Attorney, Agent, or Firm*—Wei Te Chung

(57) ABSTRACT

A heat dissipating assembly (10) includes a heat sink (12), a pair of clips (14), and a pair of holders (16). The heat sink includes a chassis (20) defining a pair of slots (24) spaced from each other and a plurality of fins (22) extending from the chassis between the slots. Each clip includes a central horizontal portion (42), two pressing bodies (40) extending from respective sides of the horizontal portion, and two legs (44) extending from respective distal ends of the pressing bodies. Each leg defines an aperture (46). Each holder has a tab (62) and a U-shaped hook (64) depending perpendicularly from respective opposite ends thereof. Each hook is elastically deformable to be engagingly received in the slot of the chassis. The horizontal portion of each clip is located between the tab and the hook of the holder, whereby the clip is attached to the heat sink by the holder. The apertures of the clips are captured by catches (72) of a retention module (70) mounted on an electronic device, so that the heat dissipating assembly is firmly mounted to the electronic device.

8 Claims, 3 Drawing Sheets

HEAT DISSIPATING ASSEMBLY

BACKGROUND OF THE INVENTION

1. Field of the Invention

The present invention relates to a heat dissipation assembly, and more particularly to a heat dissipation assembly which includes a heat sink and a clip mounted on the heat sink in advance.

2. The Related Art

Generally, a heat dissipating assembly for an electronic device comprises a heat sink and at least one clip. The clip includes a pressing portion and two arms extending from opposite ends of the pressing portion. Each arm defines an aperture for engaging with a catch formed on a socket on which the electronic device is mounted, thereby securing the heat sink to the electronic device.

However, the clip cannot be attached to the heat sink before engaging with the socket, which makes assembling the clip and the heat sink to the socket cumbersome and complicated. Furthermore, the clip and heat sink must be packed and transported separately, which results in high costs. Examples of conventional clips are disclosed in Taiwan Patent Applications Nos. 85211135 and 85214941, and U.S. Pat. Nos. 5,602,719 and 5,600,540.

SUMMARY OF THE INVENTION

An object of the present invention is to provide a heat dissipating assembly which includes a heat sink and a clip attached to the heat sink, for facilitating attachment thereof to an electronic device.

Another object of the present invention is to provide a heat dissipating assembly which reduces packaging and transportation costs.

To achieve the above objects, a heat dissipating assembly in accordance with the present invention comprises a heat sink, a pair of clips and a pair of holders forming hooks. The heat sink includes a chassis defining two slots. The hooks of the holders are elastically deformable to be interferentially received in the slots of the chassis of the heat sink, for attaching the clips to the heat sink.

These and additional objects, features, and advantages of the present invention will become apparent after reading the following detailed description of a preferred embodiment of the invention taken in conjunction with the appended drawings.

DESCRIPTION OF THE PREFERRED EMBODIMENT

Figure 1:
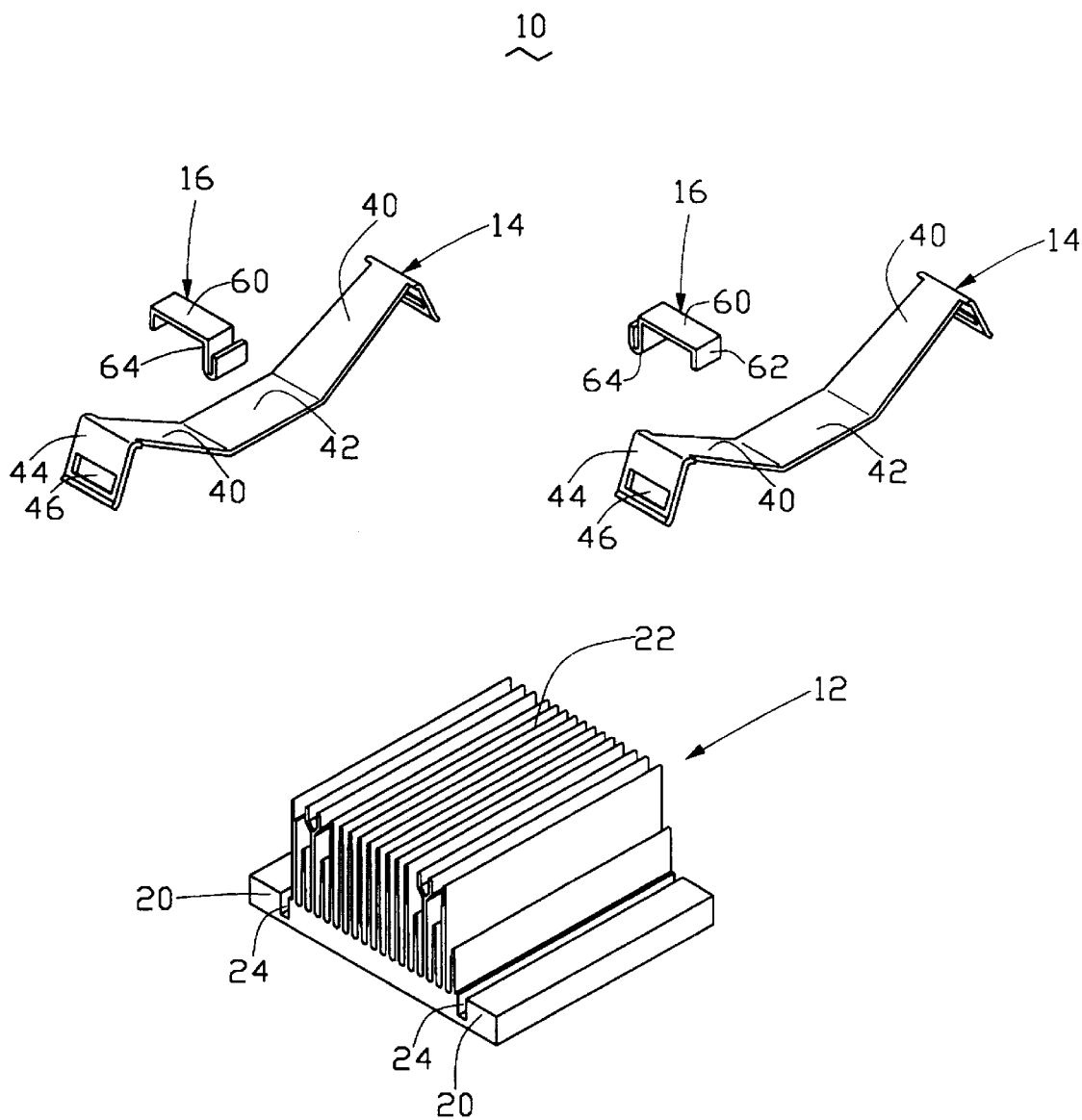
FIG. 1 is an exploded view of a heat dissipating assembly in accordance with the present invention.

Referring to FIG. 1, a heat dissipating assembly 10 comprises a heat sink 12, a pair of clips 14 and a pair of holders 16. The heat sink 12 includes a chassis 20 defining a pair of slots 24 spaced from each other around the side platform sections (not labeled), and a plurality of fins 22 extending vertically from the chassis 20 between the slots 24.

Each clip 14 has a central horizontal portion 42, two pressing bodies 40 extending from respective sides of the central horizontal portion 42, and two legs 44 extending from respective opposite distal ends of the pressing bodies 40. Each leg 44 defines an aperture 46 for receiving a pair of corresponding catches 72 formed on a retention module 70 (see FIG. 3). Each holder 16 includes a base 60, a tab 62 depending perpendicularly from an end of the base 60, and a U-shaped hook 64 depending perpendicularly from an opposite end of the base 60.

Figure 2:
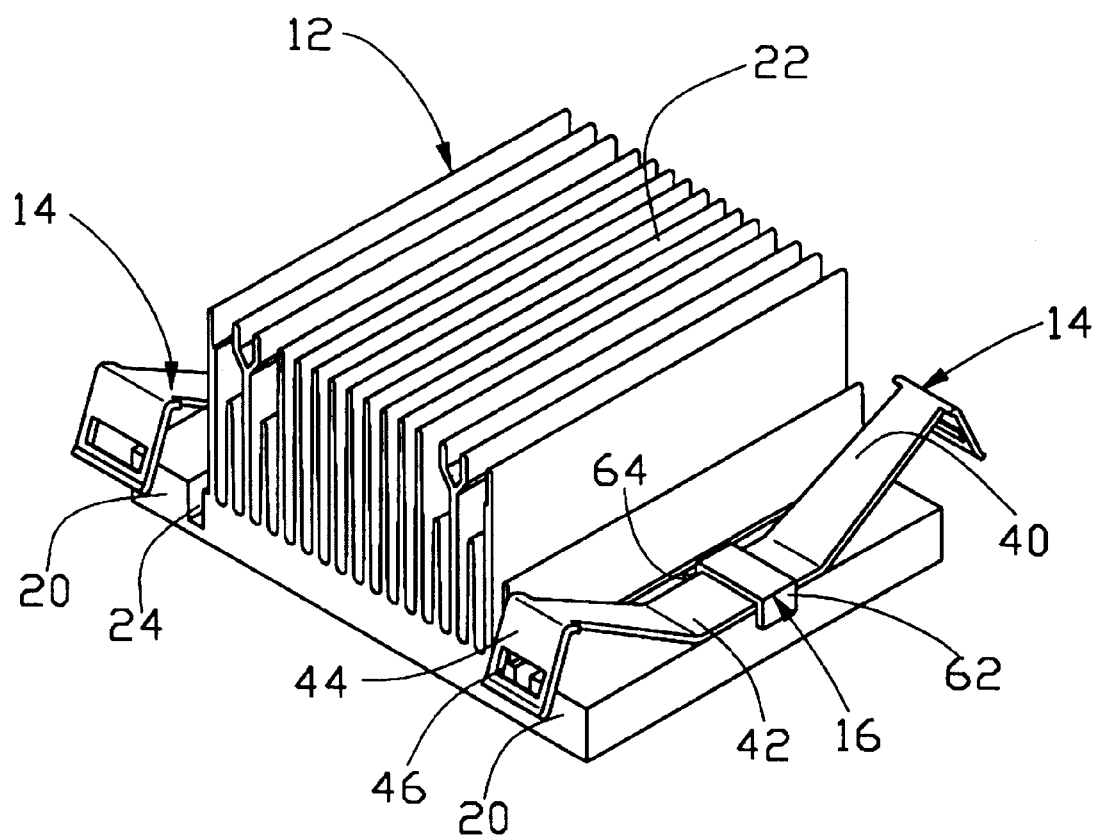
FIG. 2 is an assembled view of FIG. 1.

Also referring to FIG. 2, a pair of clips 14 is placed on respective opposite sides of the fins 22 of the chassis 20. The holders 16 are attached to the heat sink 12 by the hooks 64 interferentially engaging with the respective slots 24 of the chassis 20. The central horizontal portion 42 of each clip 14 is located between the tab 62 and the hook 64 of each holder 16. The tab 62 of each holder 16 interferentially abuts the side surface (not labeled) of the chassis 20. Thus, the clips 14 and the heat sink 12 are preassembled together before being mounted to an electronic device (not shown).

Figure 3:
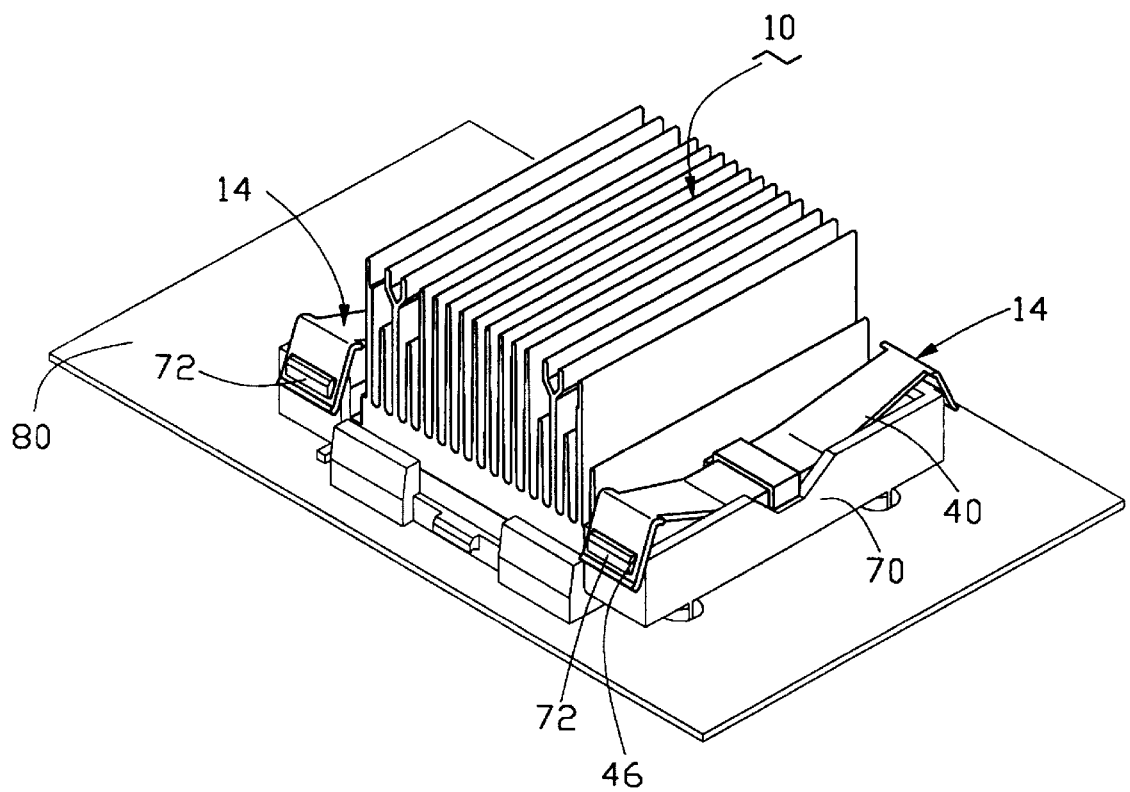
FIG. 3 is a view of the assembled heat dissipating assembly attached to an electronic device.

Referring to FIG. 3, in assembly, the heat dissipating assembly 10 is attached to an electronic device (not shown) mounted on a printed circuit board 80. The apertures 46 of the clips 14 are captured by the catches 72 of the retention modules 70 mounted at opposite sides of the electronic device respectively. Thus the heat dissipating assembly 10 is easily attached to the electronic device.

The heat dissipating assembly 10 of the present invention has at least the following advantages:

1. Each hook 64 is elastically deformable for being interferentially received in the slot 24 of the chassis 20, with the central horizontal portion 42 of the clip 14 located between the tab 62 and the hook 64 of the holder 16. Thus each clip 14 is securely attached to the heat sink 12. This makes it easy to mount the heat dissipating assembly 10 to the electronic device using the clips 14.

2. Since the clips 14 and the heat sink 12 are assembled together in advance, packing and transportation thereof are simplified and cheaper.

The embodiment was chosen and described in order to best explain the principles of the invention and its practical application, to thereby enable others skilled in the art to best utilize the invention in various embodiments and various modifications as are suited to the particular use contemplated. Various modifications to the present invention can be made to the preferred embodiment by those skilled in the art without departing from the true spirit and scope of the invention as defined by the appended claims.

What is claimed is:

1. A heat dissipating assembly comprising:
   a heat sink including a chassis defining at least one slot therein;
   at least one clip; and
   at least one holder separate from the at least one clip and depressing the at least one clip against the chassis of the heat sink, the holder forming at least one hook which is elastically deformable to be received in the slot of the chassis, for detachably fastening the clip to the heat sink.

2. The heat dissipating assembly as recited in claim 1, wherein the chassis of the heat sink defines a pair of slots spaced from each other and a plurality of fins extending from the chassis between the slots.

3. The heat dissipating assembly as recited in claim 1, wherein the clip comprises a plurality of pressing bodies and a plurality of legs respectively extending from distal ends of the pressing bodies.

4. The heat dissipating assembly as recited in claim 1, wherein at least one tab is formed on the holder opposite to the hook.

5. The heat dissipating assembly as recited in claim 4, wherein a horizontal portion is formed at the middle of each clip, and is located between the tab and the hook of the holder.

6. A heat dissipating assembly comprising:
- a heat sink including a chassis defining two opposite side platform sections with plural fins extending vertically from the chassis between said two side platform sections;
- a pair of clips reespectively disposed on the corresponding side platform sections along a longitudinal direction thereof;
- a pair of holders respectively secured to the corresponding side platform sections and cooperating with the corresponding side platform sections to retainably sandwich the corresponding clips therebetween.

7. The assembly as recited in claim 6, wherein each of said holders includes a base abutting against the corresponding clip, a hook section retainably engaged with the heat sink, and a tab restraining lateral movement of the corresponding clip.

8. The assembly as recited in claim 7, wherein the hook section and the tab are respectively positioned on two sides of the base.

\* \* \* \* \*